United States Patent [19]

Mitchell

[11] Patent Number: 4,643,499

[45] Date of Patent: Feb. 17, 1987

[54] COMPONENT MOUNTING APPARATUS

[75] Inventor: John P. Mitchell, Summit, N.J.

[73] Assignee: AT&T Bell Laboratories, Murray Hill, N.J.

[21] Appl. No.: 772,304

[22] Filed: Sep. 4, 1985

[51] Int. Cl.⁴ .............................................. H01R 9/09
[52] U.S. Cl. ......................... 339/17 CF; 339/DIG. 3
[58] Field of Search ............ 339/17 CF, 17 M, 59 M, 339/61 M, 75 M, 75 MP, 91 R, DIG. 3

[56] References Cited

U.S. PATENT DOCUMENTS

| | | | |
|---|---|---|---|
| 3,824,525 | 7/1974 | Keller | 339/91 R |
| 3,870,385 | 3/1975 | Avakian et al. | 339/48 |
| 3,951,495 | 4/1976 | Donaher et al. | 339/17 CF |
| 3,971,610 | 7/1976 | Buchoff et al. | 339/17 |
| 4,050,755 | 9/1977 | Hasircoglu | 339/17 CF |
| 4,144,648 | 3/1979 | Grovender | 339/75 |
| 4,184,133 | 1/1980 | Gehle | 333/238 |
| 4,202,583 | 5/1980 | Dalamangas | 339/59 |
| 4,209,481 | 6/1980 | Kashiro et al. | 29/877 |
| 4,242,157 | 12/1980 | Gehle | 156/64 |
| 4,330,163 | 5/1982 | Aikens et al. | 339/17 CF |
| 4,401,352 | 8/1983 | Heisey | 339/17 CF |
| 4,402,561 | 9/1983 | Grabbe et al. | 339/17 CF |
| 4,408,836 | 10/1983 | Kikuno | 350/334 |
| 4,459,636 | 7/1984 | Meister | 361/321 |

OTHER PUBLICATIONS

"Elastomeric Connector", *Electronic Packaging & Production*, Aug. 1985, p. 121.

*Primary Examiner*—Neil Abrams
*Attorney, Agent, or Firm*—Dwight A. Marshall

[57] ABSTRACT

Apparatus for mounting a component on a printed wiring circuit board. The mounting assembly comprises a quadrilateral configured member formed of a flexible polymer insulating material to have a central chamber for holding the component. Side walls surrounding the chamber have channels formed therein for receiving edges of the component with the lower surface of the channels having directional conducting particles positioned therein at locations corresponding to the component terminals. Side walls of the component mounting apparatus have a reduced area forming a flexible hinge enabling a force to be applied to the component to maintain each component terminal in compressed engagement with corresponding conducting particles and establish an electrical conducting path between the component terminal and circuit board.

12 Claims, 8 Drawing Figures

COMPONENT MOUNTING APPARATUS

1. FIELD OF THE INVENTION

This invention relates to component mounting apparatus. In particular, it relates to apparatus for mounting components on printed wiring circuit boards.

2. BACKGROUND OF THE INVENTION

Integrated semiconductor circuit devices, often times referred to as chips, contain a variety of miniaturized electrical circuitry and are widely used on printed wiring circuit boards manufactured by the electronics and communications industry to form larger composite electrical circuits. A typical chip is a relatively small and fragile device commonly mounted on a ceramic substrate called a chip carrier. Electrical conducting leads generally extend outwardly from electrical circuitry of the chip and are coupled to a plurality of metallic conducting pads positioned on the chip carrier immediately adjacent each edge thereof. The chip, or the combination of the chip and the chip carrier, may be hermetically sealed to form an integrated circuit chip carrier component wherein electrical connections extend from the conducting pads, hereinafter referred to as terminals, adjacent the edges of the component to the electrical circuitry of the chip.

Mounting apparatus has been developed for use in mounting integrated circuit chip carrier components on printed wiring circuit boards, the combination of which are sometimes referred to as circuit packs, and interconnecting each of the component terminals with a portion of the board circuitry. Typically, the mounting apparatus comprises an insulated base member in which are mounted a series of aligned metallic electrical conducting members each designed to press against a terminal of a component mounted on the base member and establish an electrical connection between the component terminals and the printed wiring board circuitry. A problem arises in using this type of mounting apparatus in that the component mounting apparatus must be affixed to the printed wiring circuit board by soldering each component terminal to circuitry of the circuit board. In addition, elaborate retaining devices are required for use in holding a component on the mounting apparatus. In yet another type of mounting apparatus, fastening devices and frame structures are required for use in securing the component mounting apparatus to the printed wiring circuit board. Thus, these types of mounting apparatus greatly add to the cost of manufacturing printed wiring circuit boards.

Accordingly, a need exists for easily manufactured and low cost apparatus for mounting multiterminal components on printed wiring circuit boards. A need also exists for component mounting apparatus arranged for enabling the exchange of components on a printed wiring circuit board by easily removing one component from the mounting apparatus and installing another component to replace the removed component.

SUMMARY OF THE INVENTION

The foregoing and other problems are solved and a technical advance is achieved by apparatus arranged for enabling components having terminals to be mounted onto and removed from printed wiring circuit boards by the use of an assembly arranged for holding the component and interconnecting the component terminals with printed wiring circuitry of the circuit board.

In accordance with the invention, an assembly for holding a component on a circuit board and interconnecting the terminals thereof with circuitry of the circuit board comprises a generally quadrilateral configured member formed of a flexible polymer insulating material to have a central chamber for holding the component. The chamber has side walls each having a channel formed for receiving and holding edges of the component and with each channel having a lower surface with conducting particles positioned therein at locations corresponding to the component terminals for engaging the component terminals and establishing a directional electrical conducting path between each component terminal and the circuit board.

Also in accordance with the invention, an assembly for holding a component on a circuit board comprises side walls each having a reduced central section defining an axis parallel to a bottom surface of the side wall to form a flexible hinge. The flexible hinge enables movement of a top portion of the side wall to receive the component in a central chamber of the assembly and apply a vertical force against the edges of the component to maintain the component terminals in compressed engagement with corresponding conducting particles and establish a directional electrical conducting path between each component terminal and the circuit board.

Also in accordance with the invention, an assembly for mounting a component on a circuit board comprises a layer of conductive adhesive material applied to a bottom surface of side walls surrounding a central chamber arranged for holding the component. The conductive adhesive material secures the mounting assembly to the circuit board and maintains a directional conducting path between each component terminal through conducting particles with corresponding circuitry of the circuit board.

Also in accordance with the invention, an assembly for mounting a component on a circuit board comprises a quadrilateral configured member having a central chamber for receiving the component and having side walls each formed with a channel for receiving and holding edges of the component. A lower surface of each side wall channel has a plurality of aligned cavities each positioned to receive a component terminal and each having a bottom portion formed of an electrical conducting particle matrix for establishing an electrical conducting path between the component terminal and printed wiring circuitry of the circuit board.

In further accordance with the invention, apparatus for mounting a component on a circuit board comprises an assembly for holding the component and interconnecting the component terminals with the circuit board. The assembly comprises a ring member formed of a polymer insulating material having conducting particles positioned therein to correspond with the component terminals for establishing a directional electrical conducting path between each component terminal and circuitry of the circuit board. A generally quadrilateral configured member formed of the flexible polymer insulating material has a central chamber for holding the ring member and component and has side walls each with a channel formed therein for receiving and holding edges of the component with each component terminal in compressed engagement with a corresponding conducting particle matrix of the ring member.

DESCRIPTION OF THE DRAWING

The foregoing as well as other objects, features and advantages of the invention invention will be more apparent from a description of the drawing in which.

DETAILED DESCRIPTION

Figure 1:
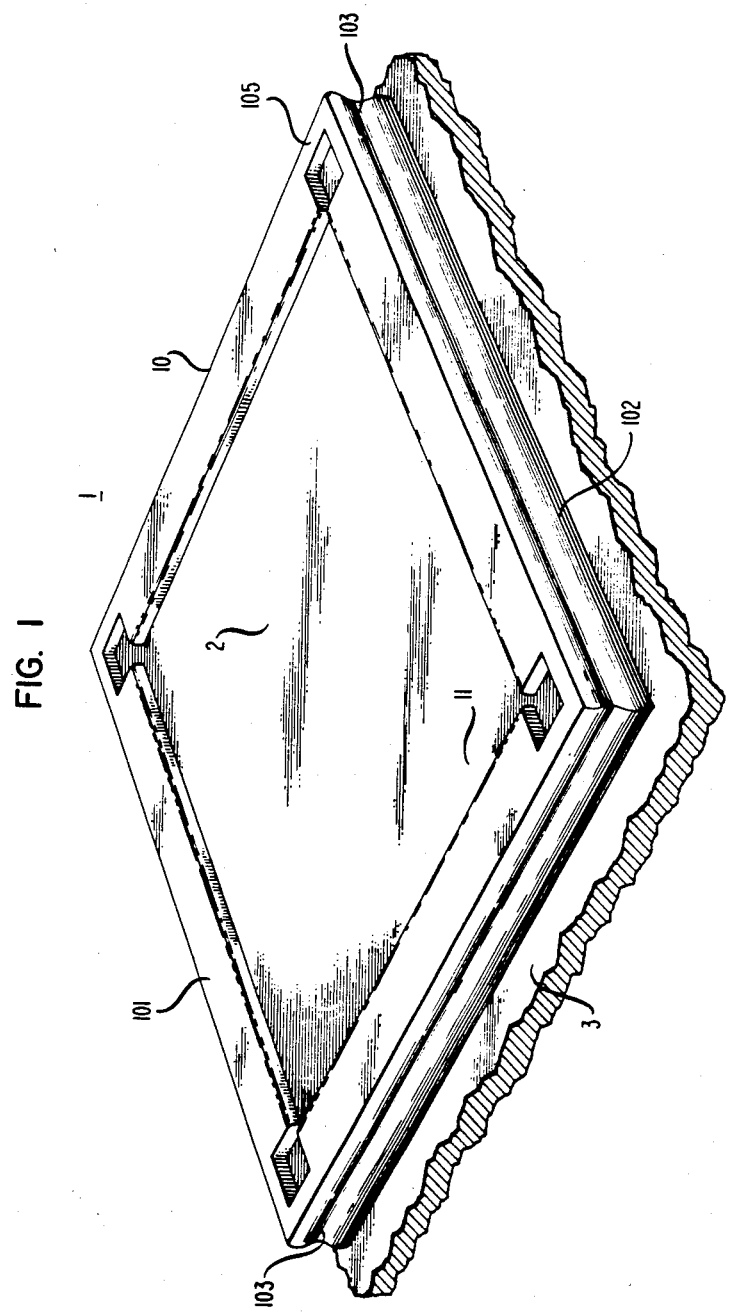
FIG. 1 is a perspective view showing apparatus of the instant invention for mounting a component on a circuit board and interconnecting the module terminals with the circuit board.

Referring to the drawing and more specifically to FIG. 1 of the drawing, the component mounting apparatus set forth therein is intended for use in mounting component 2 on a printed wiring circuit board. Component 2 generally comprises a small integrated circuit chip mounted on a chip carrier and is arranged such that electrical circuitry of the chip is coupled by connecting leads to a plurality of metallic terminals 20, FIG. 2, positioned about the perimeter of the chip carrier. Typically, the chip, or the combination of the chip, chip carrier and connecting leads, are hermetically sealed to form component 2 wherein electrical connections are made to the circuitry of the chip through terminals 20 positioned adjacent to the edges of component 2.

The component mounting apparatus is designed to hold component 2 on a printed wiring circuit board, hereinafter referred to as circuit board 3, and interconnect component terminals 20 with printed wiring paths and contact pads 30 of the circuit board 3. In assembly, the component mounting apparatus is positioned on circuit board 3 and secured thereto such that terminals 20 of component 2 can be aligned with corresponding circuit board contact pads 30. Component 2 is then snapped into the component mounting apparatus such that an electrical conducting path in the manner hereinafter set forth in detail is established between each component terminal 20 and a corresponding circuit board contact pad 30.

The component mounting apparatus is an assembly comprising a generally quadrilateral configured member 1, FIG. 1, formed preferably of a flexible polymer insulating material and may be any of a number of silicone rubber materials. Component mounting member 1 is formed with side walls 10 surrounding a central chamber 11 arranged to hold component 2. Each side wall 10, FIG. 2, surrounding central chamber 11 has a channel 100 formed therein to receive and hold an edge of component 2. In addition, side wall 10 has a reduced central section 103 defining an axis A parallel to a bottom surface of a lower portion 102 of side wall 10. Reduced section 103 forms a flexible hinge and thereby enables movement of top portion 101 with respect to the rest of side wall 10 so that component 2 may be snapped into and out of central chamber 11. Top portion 101 will return in place to hold an edge of component 2 within channel 100 and apply a vertical force against an upper surface of component 2 to hold component 2 in central chamber 11.

Each side wall channel 100 has a lower surface 104 which is intended to receive an edge of component 2 having terminals 20 positioned thereon for the purpose of establishing electrical connections with the circuitry of component 2. In one embodiment of the invention, lower portion 102 of side wall 10 is formed with particles 10400 of electrical conducting material which typically may be metallic, glassy, ceramic, or carbon particles in the form of spheres, fibers, flakes, or other various configurations. Glassy and ceramic particles may be electrically conducting in bulk or may have an electrically conducting coating such as a metallic coating. The characterizing property of such a structure is that electrical conduction occurs between particles 10400 over distances which are less than a critical distance and particles 10400 fill the space of lower side wall section 102 in such a density that a conducting path is established between lower surface 104 of channel 100 and the bottom surface of side wall 10. Lower side wall section 102 may be magnetized to align conducting particles 10400 to form vertical strings of conducting particles 10400 wherein each conducting particle 10400 located in the string is spaced adjacent another conducting particle 10400 such that a directional electrical conducting path is established between upper and lower surfaces of side wall channel 100. Thus, these conducting path strings form conducting path areas between component terminals 20 and circuit board 3 that may be thought of as matrices 1040 of conducting particles 10400 wherein a less than critical distance exists between vertically aligned ones of conducting particles 10400 while a greater than critical distance exists along horizontal and diagonally spaced ones of the conducting particles 10400 so as to electrically insulate one conducting string path area, hereinafter referred to as matrix 1040, from an adjacent conducting particle matrix 1040. In another embodiment of the invention, matrices 1040 of conducting particles 10400 are formed in lower surfaces 104 of side wall channel 100 at locations corresponding with terminals 20 of component 2. Each conducting particle matrix 1040 forming a directional electrical conducting path between a component terminal 20 and a contact pad 30 of circuit board 3 is separated from an adjacent conducting particle matrix 1040 by portion 1041 of the insulating material of side wall 10.

Figure 2:
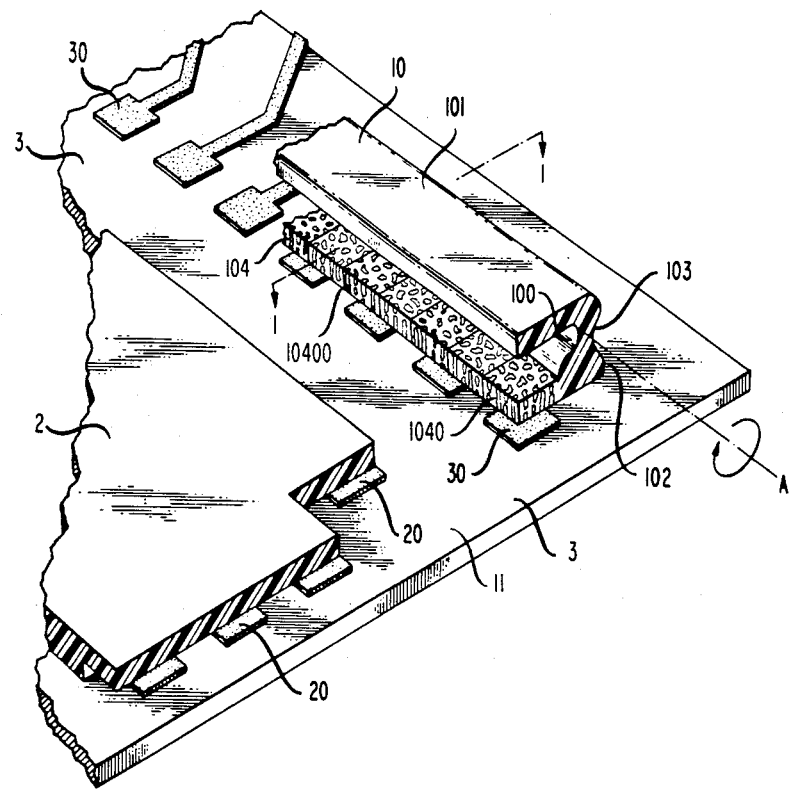
FIG. 2 is a fragmentary sectional perspective view of the component mounting apparatus set forth in FIG. 1 illustrating one embodiment of the invention for electrically interconnecting component terminals with a circuit board.
Figure 3:
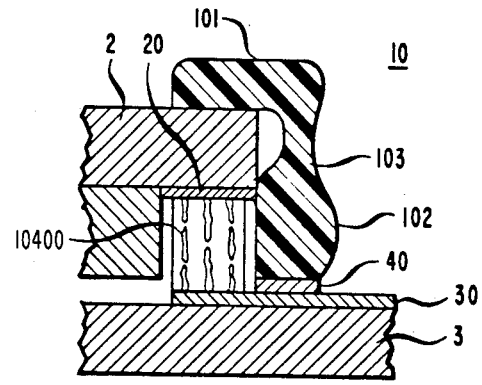
FIGS. 3 and 4 are cross-sectional views illustrating different embodiments of the invention for securing the component mounting apparatus set forth in FIG. 2 to the circuit board.

Referring now to FIG. 3 of the drawing, the cross-sectional view taken along line 1—1 of FIG. 2 illustrates an embodiment of the invention wherein component mounting member 1 is secured to circuit board 3 by means of adhesive material 4. Adhesive material 4 may be a composite material having conducting particles 10400 and magnetized such that directional electrical conducting paths are established between a bottom surface of side wall 10 and contact pads 30 coupled with electrical circuitry of circuit board 3. In assembly, adhesive material 4 holds component mounting member 1 to circuit board 3. Top portion 101 of side wall 10 is rotated around the flexible hinge established by reduced central section 103 and component 2 is installed in component mounting member 1 by each edge of component 2 being positioned in side wall channel 100. The top portion 101 then returns in a position to engage an upper surface of component 2 and exert a force thereon to maintain each component terminal 20 in compressed engagement with corresponding conducting particles 10400. An electrical conducting path is then established between each component terminal 20 through a conducting particle matrix 1040 and a bottom surface thereof in engagement with conducting adhesive material 4 to a corresponding circuit board contact pad 30. Component 2 may be removed from component mounting member 1 by rotating top portion 101 of side wall 10 backwards to release component 2 from side wall channel 100 so that component 2 may be removed from central chamber 11.

Figure 4:
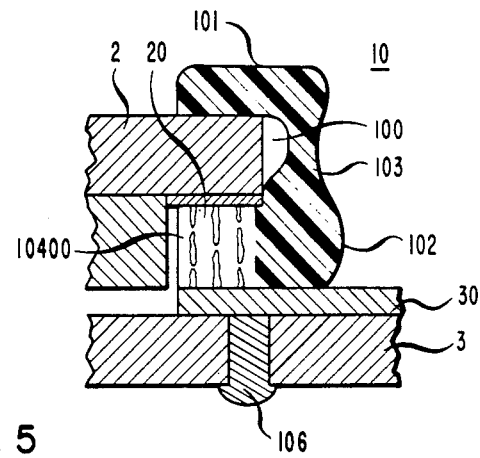

In another embodiment of the invention as set forth in FIG. 4 of the drawing, each side wall 10 or corner section of component mounting member 1 may be provided with a generally mushroom configured post member 106 extending perpendicularly downward from a bottom surface thereof. In assembly, each post member 106 is inserted into a datum hole in the circuit board 3 which is configured to receive the mushroom configured end of post member 106 and positioned such that conducting particles 10400 are held in compressed engagement with a corresponding circuit board contact pad 30. Thus, an electrical conducting path is established between each component terminal 20 and circuit board contact pad 30 through conducting particles 10400.

Figure 5:
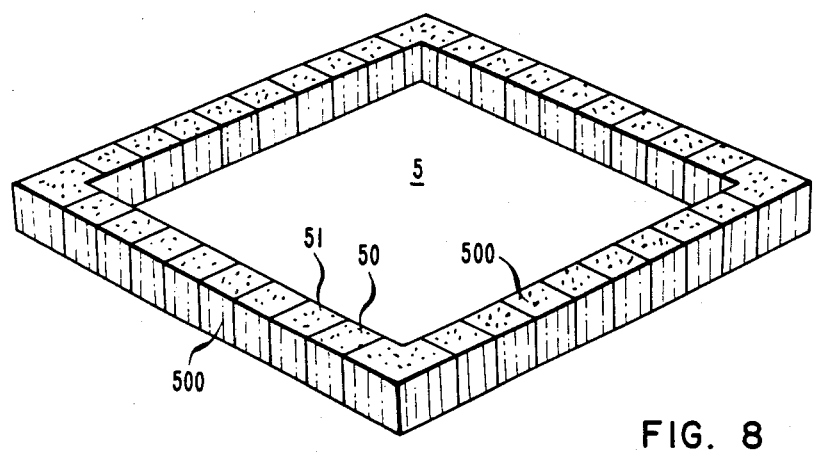
FIG. 5 illustrates a ring member for use with the component mounting apparatus set forth in FIG. 1.

In yet another embodiment of the invention, FIG. 5 of the drawing, component mounting member 1 may include a ring member 5 formed of polymer insulating material. Ring member 5 is constructed with the aforementioned conducting particles, herein designated as ring conducting particles 500, and magnetized to form vertical conducting particle string path matrices 50 each separated by matrix sections 51.

Each conducting particle matrix 50 of ring member 5 corresponds in location with one of component terminals 20 and establishes a directional electrical conducting path between an upper surface in contact with a component terminal 20 and a lower surface in contact with a contact pad 30 of circuit board 3.

Figure 6:
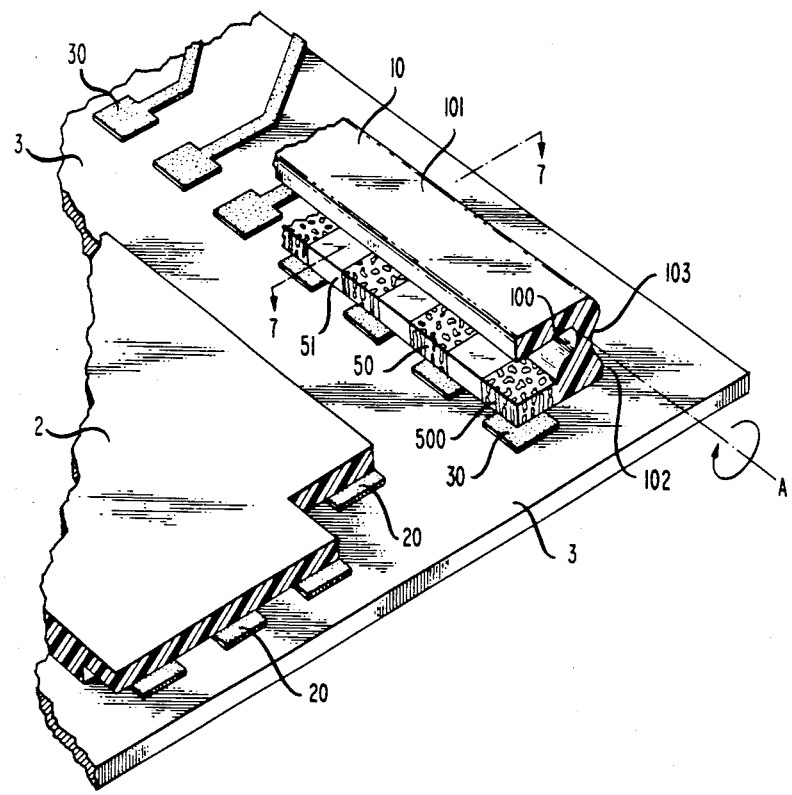
FIG. 6 is a fragmentary sectional perspective view of the component mounting apparatus set forth in FIG. 1 illustrating the use of the ring member set forth in FIG. 5 for electrically interconnecting component terminals with a circuit board.
Figure 7:
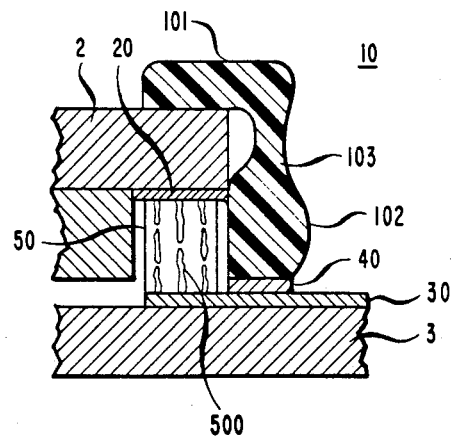
FIG. 7 is a cross-sectional view of another embodiment of the invention for securing the component mounting apparatus set forth in FIG. 6 to the circuit board.

Referring to FIGS. 6 and 7 of the drawing, and more specifically to FIG. 7, a layer of insulating adhesive material 40 is applied to the bottom surfaces of side walls 10. Component mounting member 1 is then positioned on circuit board 3 and pressed down thereon such that adhesive material 40 secures component mounting member 1 to circuit board 3. Ring member 5 is positioned within central chamber 11 of component mounting member 1 and is held in place by side walls 10 such that each conducting particle string path matrix 50 is in engagement with a contact pad 30 of circuit board 3. Upper portion 101 of side wall 10 is positioned by a rotational movement about the flexible hinge defined by reduced central section 103 such that component 2 can be snapped into central chamber 11 with each edge thereof held by channel 100 of side wall 10 such that each component terminal 20 is aligned with corresponding conducting particles 500. Upon release, upper portion 101 of each side wall 10 returns to a position to exert a downward force against component 2 and maintain each component terminal 20 in compressed engagement with conducting particle matrix 50. Thus, a directional electrical conducting path is established between each component terminal 20 through the magnetically aligned conducting particles 500 of conducting particle string path matrix 50 and contact pad 30 of circuit board 3. Component 2 may be removed from component mounting member 1 by a rotational movement of the upper portion 101 of side wall 10 about flexible hinge section 103 to enable component 2 to pop out of central chamber 11.

Figure 8:
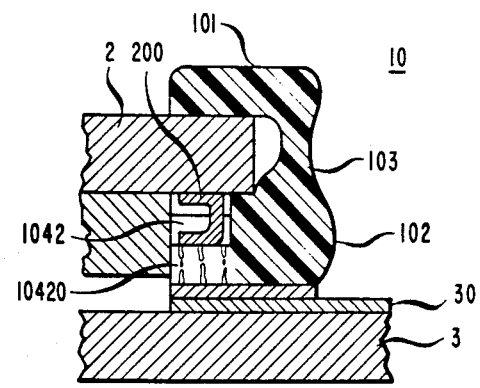
FIG. 8 is a cross-sectional view of the component mounting apparatus set forth in FIG. 1 illustrating cavities each positioned to receive a component terminal and establish an electrical conducting path between the component terminal and circuit board.

In another embodiment of the invention as set forth in FIG. 8 of the drawing, component 2 may have a generally U-configured spring type of terminal 200 positioned about the perimeter thereof. In order to accommodate this spring type of component terminal 200, side wall channel 100 may be advantageously formed with a plurality of aligned cavities 1042 corresponding with and configured to reveive component spring terminals 200. Each cavity 1042 has a bottom portion formed of an electrical conducting particles 10420 to establish an electrical conducting path between a component U-configured spring terminal 200 positioned in cavity 1042 and contact pad 30 on circuit board 3.

SUMMARY

It is obvious from the foregoing that the facility, economy, and efficiency of mounting components on printed wiring circuit boards may be enhanced by easily manufactured and low cost component mounting apparatus. It is further obvious from the foregoing that component mounting apparatus arranged with side walls having a flexible hinge structure for enabling exchanges of components on circuit boards facilies the manufacture update and repair of printed wiring circuit boards. Furthermore, it is obvious that the entire side wall structure of the component mounting apparatus could be formed with conducting particles and magnetized before curing to form directional conducting string paths for interconnecting component terminals with a circuit board.

What is claimed is:

1. Apparatus for mounting a component with terminals on a circuit board, said apparatus comprising
   an assembly for holding the component and interconnecting the terminals thereof with the circuit board characterized in that
   said assembly comprises
   a generally quadrilateral configured member formed of a flexible insulating material to have a central chamber for holding the component with said central chamber having side walls each with a reduced central section forming a channel therein with an upper surface of said channel hinged with respect to a lower surface of said channel for receiving and holding edges of the component and with said channel lower surface having matrices of directional conducting particles positioned therein at locations corresponding to the component terminals for engaging the component terminals and establishing an electrical conducting path between each component terminal and the circuit board.

2. The component mounting apparatus of claim 1 characterized in that
each said side wall comprises
said reduced central section defining an axis parallel to a bottom surface of said side wall for forming a flexible hinge to enable rotational movement of said side wall channel upper surface to receive the component in said central chamber and maintain said component terminals in engagement with ones of said matrices of directional conducting particles.

3. The component mounting apparatus of claim 2 characterized in that
said mounting apparatus comprises
a layer of adhesive material applied to said bottom surfaces of said side walls for securing said insulating member to the circuit board and maintaining a conducting path directed between a bottom surface of said directional conducting particle matrice and corresponding circuitry of the circuit board.

4. The component mounting apparatus of claim 2 characterized in that
each said side wall comprises
generally mushroom configured post members formed to extend perpendicularly downward from said side wall bottom surface for insertion into corresponding datum holes of the circuit board to secure said insulating member to the circuit board by compressing said conducting particle matrice lower surface in engagement with circuitry of the circuit board.

5. The component mounting apparatus of claim 1 characterized in that
each said insulating member side wall channel comprises
a plurality of aligned cavities each positioned on said channel lower surface to receive a component terminal and each having a bottom portion formed of one of said matrices of directional electrical conducting particles to establish an electrical conducting path between the component terminal and circuitry of the circuit board.

6. Apparatus for mounting a component with terminals on a circuit board, said apparatus comprising
an assembly for holding the component and interconnecting the terminals thereof with the circuit board characterized in that
said assembly comprises
a ring member formed of a polymer insulating material and having conducting particles positioned therein to correspond with the component terminals for establishing a directional electrical conducting path between each component terminal and the circuit board, and
a generally quadrilateral configured member formed of said flexible polymer insulating material to have a central chamber for holding said ring member and the component on the circuit board with said chamber having side walls each with a reduced central section functional with an upper surface of said ring member to form a channel with an upper surface of said channel hinged with respect to said ring member upper surface for receiving and holding edges of the component with each component terminal in compressed engagement with corresponding conducting particles of said ring member.

7. The component mounting apparatus of claim 6 characterized in that
each said insulating member side wall comprises
said reduced central section defining an axis parallel to a bottom surface of said side wall for forming a flexible hinge to enable rotational movement of a top portion of said side wall to open said channel to receive the component in said central chamber and to close said channel to exert a force on the component to maintain the component terminals in compressed engagement with corresponding ones of said ring member directional conducting particles.

8. The component mounting apparatus of claim 7 characterized in that
said mounting apparatus comprises
a layer of adhesive material applied to said bottom surfaces of said side walls for securing said insulating member to the circuit board.

9. The component mounting apparatus of claim 8 characterized in that
said ring member comprises
a member formed of said flexible polymer insulating material into a generally rectangular cross-sectional area having magnetized vertical strings of conducting particles positioned therein at locations corresponding to the component terminals for establishing a directional electrical conducting path extending between each component terminal and the circuit board.

10. Apparatus for mounting a component with terminals on a circuit board, said apparatus comprising
an assembly for holding the component and interconnecting the terminals thereof with the circuit board characterized in that
said assembly comprises
a ring member formed of a flexible polymer insulating member into a generally rectangular crosssectional area having matrices of magnetized conducting particles positioned therein at locations corresponding with the component terminals for establishing a directional electrical conducting path between opposing surfaces of each of said matrices,
a generally quadrilateral configured member formed of said flexible polymer insulating material to have a central chamber for holding said ring member around the perimeter thereof and the component with said chamber having side walls each with a channel formed therein in cooperation with said ring member for receiving and holding edges of the component and each side wall having a reduced central section forming a flexible hinge for enabling a top portion of said side wall to exert a force on the component and hold each component terminal in compressed engagement with one of said ring member opposing conducting matrice surfaces, and
means applied to bottom surface of said side walls for securing said quadrilateral configured member to the circuit board with said other ring member opposing conducting matrice surface in engagement with the circuit board.

11. Apparatus for mounting a component with terminals on a circuit board comprising
a generally quadrilateral configured member formed on a flexible polymer insulating material to have a central chamber for holding the component with said chamber having side walls each with a channel formed therein to have a lower surface with matrices of conducting particles positioned therein at locations corresponding to the component terminals and with each side wall having a reduced central section defining a hinge for enabling movement of an upper surface of said channel with respect to said channel lower surface to maintain terminals of the component having edges positioned in said side wall channels in compressed engagement with said conducting particle matrices to establish an electrical conducting path between each component terminal and the circuit board.

12. Apparatus for mounting a component with terminals on a circuit board comprising a ring member formed of a flexible polymer insulating material having magnetized conducting particles positioned therein at locations corresponding with ones of the component terminals for establishing a directional vertical electrical conducting path between opposing surfaces of said ring member, a general quadrilateral configured member formed of a polymer insulating material to have a central chamber for holding said ring member around the perimeter thereof and the component with said chamber having side walls each functional with said ring member to form a channel for receiving and holding edges of the component and each side wall having a reduced central section for forming a flexible hinge enabling a top portion of said side wall to rotate with respect to said ring member to exert a force on the component and hold the component terminals in compressed engagement with ones of said ring member opposing conducting particle surfaces, and adhesive means applied to bottom surfaces of said side walls for securing said quadrilateral configured member to the circuit board with said other ring member opposing surface of said conducting particles in engagement with the circuit board to establish a directional electrical conducting path between circuitry of the circuit board and the component terminals.

* * * * *